United States Patent
Pavlovic et al.

(10) Patent No.: US 11,146,284 B2
(45) Date of Patent: Oct. 12, 2021

(54) SPACE-FILLING CURVE DICTIONARY-BASED COMPRESSION

(71) Applicant: SAP SE, Walldorf (DE)

(72) Inventors: Mirjana Pavlovic, Lausanne (CH); Kai-Niklas Bastian, Malsch (DE)

(73) Assignee: SAP SE, Walldorf (DE)

( * ) Notice: Subject to any disclaimer, the term of this patent is extended or adjusted under 35 U.S.C. 154(b) by 343 days.

(21) Appl. No.: 15/970,737

(22) Filed: May 3, 2018

(65) Prior Publication Data

US 2019/0341930 A1 Nov. 7, 2019

(51) Int. Cl.
*G06F 16/22* (2019.01)
*H03M 7/30* (2006.01)

(52) U.S. Cl.
CPC ...... *H03M 7/3082* (2013.01); *G06F 16/2264* (2019.01); *H03M 7/3064* (2013.01); *H03M 7/70* (2013.01)

(58) Field of Classification Search
CPC .... G06F 16/221; G06F 16/1744; G06F 16/29; G06F 16/2237; G06F 16/2228; G06F 16/283; G06F 16/22
See application file for complete search history.

(56) References Cited

U.S. PATENT DOCUMENTS

| 6,223,182 B1 * | 4/2001 | Agarwal ............... G06F 16/284 |
| 2015/0046411 A1 | 2/2015 | Kazmaier et al. |
| 2015/0324373 A1 * | 11/2015 | Tyercha ............. G06F 16/2237 707/722 |

OTHER PUBLICATIONS

Franz Färber et al.,The SAP HANA Database—An Architecture Overview. IEEE Data Eng. Bull. 35, 1 , 2012, 28-33.
Per-Åke Larson et al.,SQL server column store indexes. In SIGMOD, Jun. 12-16, 2011, 1177-1184, Athens, Greece.
Oscar Martinez-Rubi et al., Benchmarking and improving point cloud data management in MonetDB, SIGSPATIAL Special 6, 2, 2014, 11-18.
Mohamed F. Mokbel et al.,Space-Filling Curves for Query Processing. In Encyclopedia of Database Systems, 2009 2675-2680.
Herbert Tropf et al.,Multidimensional Range Search in Dynamically Balanced Trees. Angewandte Info. 2, 1981, 71-77.
Peter van Oosterom et al., Massive point cloud data management: Design, implementation and execution of a point cloud benchmark. Computers & Graphics 49, Feb. 7, 2015, 92-125.

* cited by examiner

*Primary Examiner* — Apu M Mofiz
*Assistant Examiner* — Cindy Nguyen
(74) *Attorney, Agent, or Firm* — Fountainhead Law Group P.C.

(57) ABSTRACT

Embodiments of the present disclosure pertain to point cloud data. In one embodiment, the present disclosure includes a computer implemented method comprising for compressing and storing point cloud data using a space-filling curve data structure and a dictionary space data structure. In another embodiment, the present disclosure includes applying a query against the data structures to retrieve point cloud data within a range.

20 Claims, 7 Drawing Sheets

SPACE-FILLING CURVE DICTIONARY-BASED COMPRESSION

BACKGROUND

The present disclosure relates to computing, and in particular, to systems and methods for authorizing access to computing resources.

Nowadays, massive amounts of point cloud data can be collected as a result of advances in data acquisition and processing technologies, such as dense image matching and airborne LiDAR (Light Detection and Ranging) scanning, for example. A point cloud typically refers to a set of data points in some coordinate system. In a three-dimensional coordinate system, these points are usually defined by X, Y, and Z coordinates, and often are intended to represent the external surface of an object, for example. With the increase in volume and precision, point cloud data offers a useful source of information for natural resource management, urban planning, self-driving cars and more by modeling point data through numerous properties such as x, y, and z coordinates, angle of scan, and color. At the same time, the scale at which point cloud data is produced introduces management challenges. For instance, given the massive amounts of point cloud data, it is important to achieve efficiency both in terms of querying performance and space requirements (e.g., storage footprint).

Traditional solutions to point cloud data management are file-based, where points are stored in files in a predefined format and processed by application-specific algorithms. These solutions typically employ efficient compression schemes, but 1) face scalability problems with respect to the increasing number and size of files to process and 2) lack the declarative power of a DBMS. Accordingly, file-based solutions to point cloud management offer space efficiency, however, cannot scale to such massive data and provide the same declarative power as a database management system (DBMS).

Embodiments of the disclosure provide advantageous techniques for improved point cloud data management techniques.

SUMMARY

Embodiments of the present disclosure pertain to point cloud data. In one embodiment, the present disclosure includes a computer implemented method comprising for compressing and storing point cloud data using a space-filling curve data structure and a dictionary space data structure. In another embodiment, the present disclosure includes applying a query against the data structures to retrieve cloud point data within a range.

In one embodiment, the present disclosure includes a computer implemented method comprising receiving point cloud data, the point cloud data comprising a plurality of point cloud data entries, each point cloud data entry comprising a plurality of values for a corresponding plurality of dimensions to describe a position, mapping the point cloud data to a dictionary space data structure and a space-filling curve data structure, wherein the dictionary space data structure captures the distinct values of point cloud data in each dimension, and the space-filling curve data structure comprises, for each point cloud data entry, a code from a plurality of codes and a plurality of offsets corresponding to the plurality of dimensions, wherein the codes associate point cloud data entries with one of a plurality of cells across the dimensions and the offsets uniquely identify the point cloud data entries in the cells, storing the space-filling curve data structure and the dictionary space data structure in a database.

In one embodiment, the codes identify particular cells that particular point cloud data entries belong to.

In one embodiment, the space-filling curve data structure maps a record for each point cloud data entry to a particular position in the dictionary space where a value for the point cloud data entry is stored.

In one embodiment, each cell comprises a maximum number of point cloud data entries.

In one embodiment, the cells are formed by dividing a total number of distinct values in each dimension into a plurality of segments along each dimension, wherein each segment has the same number of distinct values for a particular dimension.

In one embodiment, segments for a first dimension have a same number of distinct values as segments for a second dimension.

In one embodiment, segments for a first dimension have a different number of distinct values as segments for a second dimension.

In one embodiment, the dictionary space data structure comprises a plurality of entries comprising values for each dimension.

In one embodiment, the dictionary space data structure comprises a first set of values for an x-dimension and a second set of values for a y-dimension.

In one embodiment, the dictionary space data structure comprises a third set of values for z-dimension.

In one embodiment, each code corresponds to a plurality of point cloud data entries in a cell and the offsets corresponding to each code uniquely identify a point cloud data entry in the cell.

In one embodiment, the mapping transforms the point cloud data from the plurality of dimensions to one dimension.

In one embodiment, the codes are generated using a space-filling curve.

In one embodiment, the space-filling curve is one of a Hilbert curve, the Gray-code curve, or the Z-order.

In one embodiment, mapping comprises generating a plurality of dimension dictionaries for the dictionary space, wherein each dimension dictionaries comprises sorted distinct values of the point cloud data, for each dimension, assigning each point cloud data entry to one of a plurality of cells, and in accordance therewith, generating codes for each point cloud data entry corresponding the cells in each dimension that a point cloud data entry is assigned to, storing an offset defining a position within each cell of each point cloud data entry, and sorting the codes and offsets corresponding to the point cloud data entries.

In one embodiment, the method further includes performing a multidimensional query of the stored point cloud data comprising determining codes in a query range, searching for a candidate set in the space-filling curve data structure based on the codes in the query range, and determining one or more query result point cloud data entries from a plurality of point cloud data entries in the candidate set based on the offsets in the space-filling curve data structure and the values in the dictionary space data structure, wherein the query result point cloud data entries have values within the query range.

The following detailed description and accompanying drawings provide a better understanding of the nature and advantages of the present disclosure.

BRIEF DESCRIPTION OF THE DRAWINGS

FIG. 3 illustrates a dictionary and index vector.

FIG. 6 illustrate mapping cloud point data to space-filling curve and dictionary space data structures.

DETAILED DESCRIPTION

In the following description, for purposes of explanation, numerous examples and specific details are set forth in order to provide a thorough understanding of the present disclosure. Such examples and details are not to be construed as unduly limiting the elements of the claims or the claimed subject matter as a whole. It will be evident to one skilled in the art, based on the language of the different claims, that the claimed subject matter may include some or all of the features in these examples, alone or in combination, and may further include modifications and equivalents of the features and techniques described herein.

Features and advantages of the present disclosure include techniques for storing and managing point cloud data in a database. In one example embodiment, point cloud data is stored in a column-store database management system (DBMS) that may be driven both by time and space efficiency requirements. More specifically, in one embodiment an encoding scheme uses dictionary-based compression (DBC) in the spatial domain and enhances it with indexing capabilities, minimizing both space and time requirements, for example. In one example embodiment, a Space-Filling Curve Dictionary-Based Compression (SFC-DBC) process compresses point cloud data using DBC, leveraging the frequent repetition of the values for x, y, and z coordinates across point cloud entries. This property may be particularly evident for data obtained through image matching processing, for example, as such data inherits the grid-like structure of images. DBC significantly minimizes space requirements. However, it is agnostic to spatial data properties. To preserve and exploit spatial data properties and thus optimize further for query execution, DBC may be combined with Space-Filling Curve (SFC) order to produce a new compression scheme, for example.

According to one embodiment, a point cloud entry may be represented through its position in an artificially introduced 3D dictionary space and indexed using a SFC order. Accordingly, SFC-DBC may not require additional space resources, and yet significantly optimizes query execution, compared to traditional DBC. With respect to the traditional space-filling curve-based approaches, it may minimize storage footprint and increase resilience to skew, for example.

Figure 1:
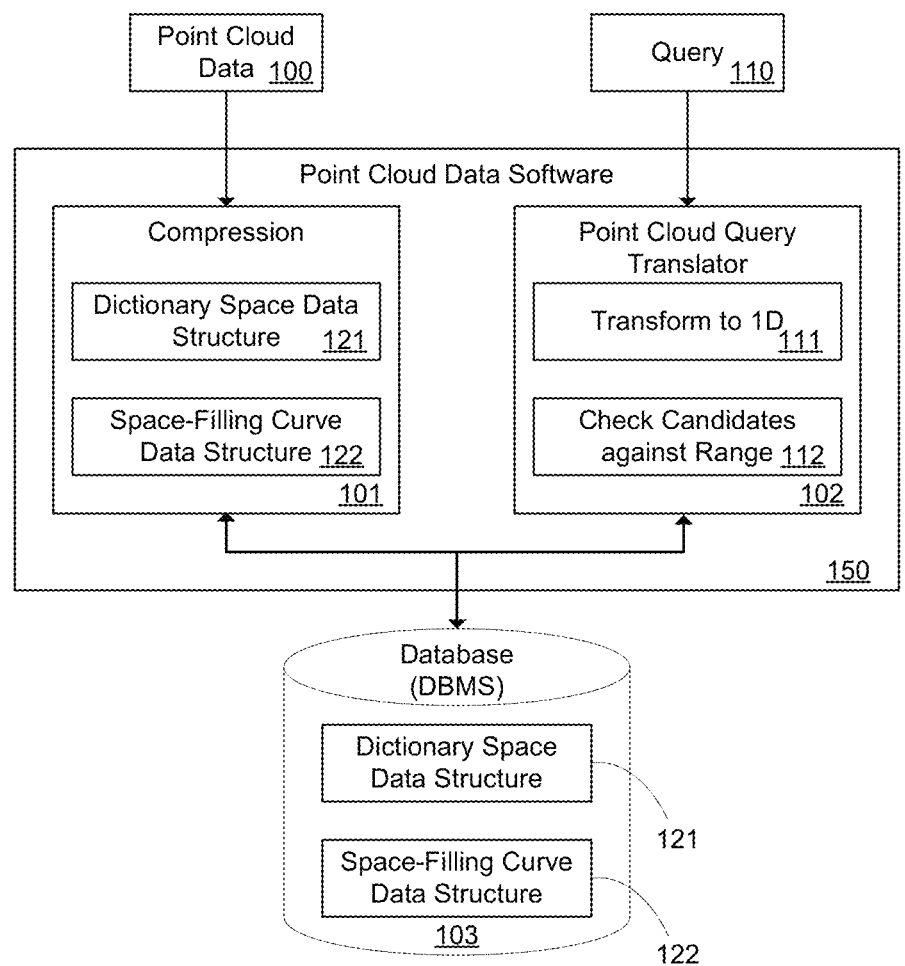
FIG. 1 further illustrates an architecture for compressing, storing, and querying cloud point data.

FIG. 1 illustrates various aspects of the present disclosure. In one embodiment, the present disclosure includes software/computer code for compressing and storing point cloud data and executing a query against the stored data, for example. Point cloud data software 150 may include a compressing component 101 and a query component 102, for example. Compression component 101 may receive point cloud data. The point cloud data may include a plurality of point cloud data entries (e.g., x,y,z-values) describing the position of an entry (or point) in space (e.g., 3-space). Each point cloud data entry may comprise a plurality of values for a corresponding plurality of dimensions to describe a position (e.g., an x value, y value, and z value). Compression component 101 may map the point cloud data to a dictionary space data structure 121 and a space-filling curve data structure 122. The dictionary space data structure may capture distinct values of point cloud data in each dimension, for example. The space-filling curve data structure may include a plurality of codes (SPCcodes) and a plurality of offsets. Each point cloud data entry may be associated with one code from the plurality of codes and a plurality of offsets corresponding to the plurality of dimensions. As illustrated below, a record in the space-filling curve data structure may include a particular SPCcode and one offset for each dimension of cloud point data stored in the data structures. The codes may associate point cloud data entries with one of a plurality of cells across the dimensions and the offsets may uniquely identify the point cloud data entries in the cells, for example. As illustrated in FIG. 1, the space-filling curve data structure and the dictionary space data structure may be stored in a database 103 (e.g., a database management system (DBMS)), for example.

FIG. 1 further illustrates querying cloud point data according to an embodiment. In this example, point cloud data software includes a point cloud query translator 102. Point cloud query translator 102 may receive a query 110 and perform a two-step process to retrieve query results from data structures 121 and 122. First, the query may be translated from n-dimensions to one dimension (1D) and executed to find a candidate set at 111. Next, candidates are checked against the range to remove false positives, for example. Point cloud data entries within the query range may then be returned by the system as query result point cloud data.

Figure 2:
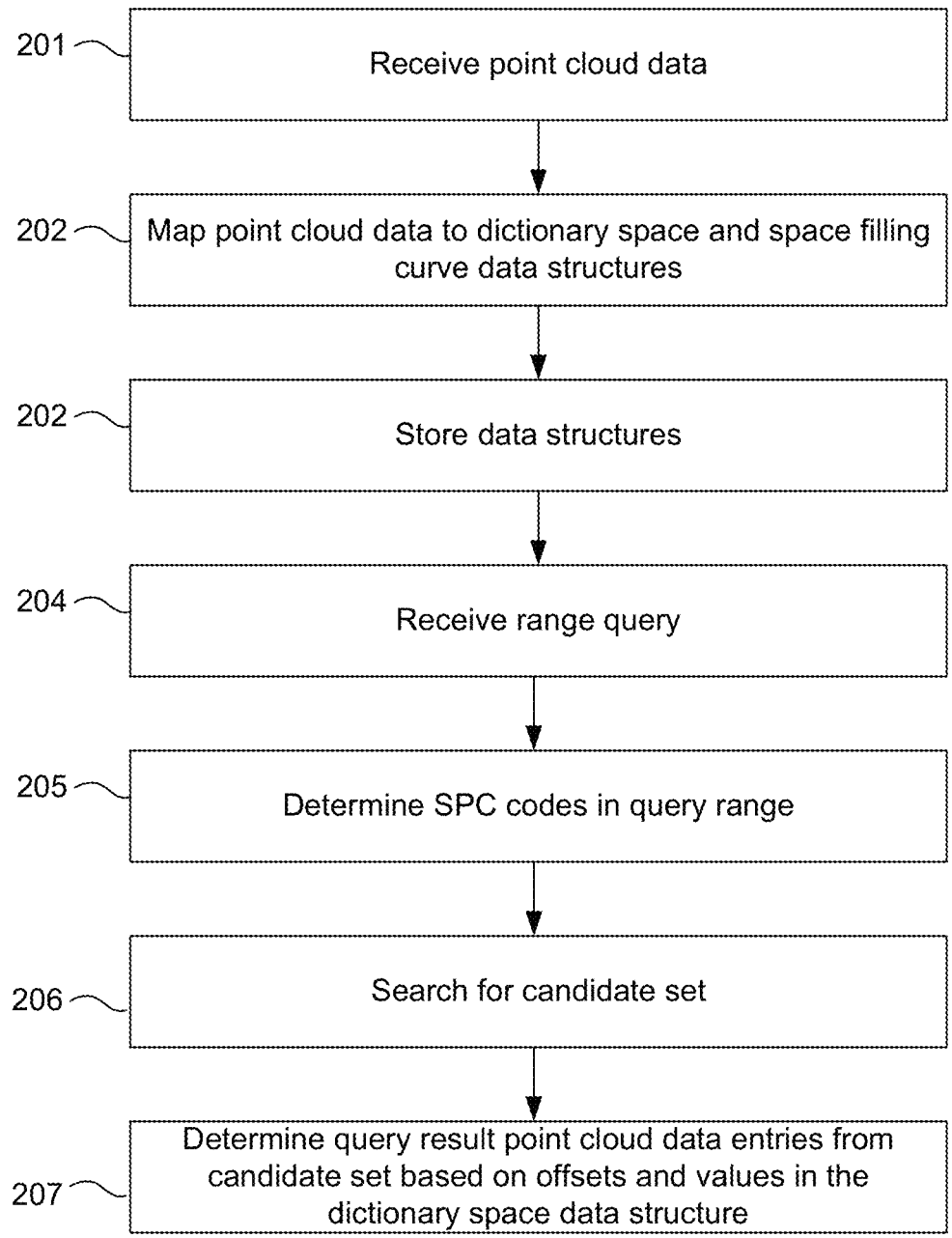
FIG. 2 illustrates a process of storing and querying cloud point data.

FIG. 2 illustrates a process of storing and querying data according to an embodiment. At 201, point cloud data is received. The point cloud data may include a plurality of point cloud data entries, where each point cloud data entry includes a plurality of values for a corresponding plurality of dimensions to describe a position, for example. At 202, the point cloud data is mapped to a dictionary space data structure and a space-filling curve data structure. As mentioned above, the dictionary space data structure captures the distinct values of point cloud data in each dimension. The space-filling curve data structure comprises, for each point cloud data entry, a code from a plurality of codes and a plurality of offsets corresponding to the plurality of dimensions. The codes associate point cloud data entries with one of a plurality of cells across the dimensions and the offsets uniquely identify the point cloud data entries in the cells, for example. In one embodiment, mapping the point cloud data to the data structures may include generating a dictionary space for each dimension. Each dictionary space for each dimension may comprise sorted distinct values of the point cloud data (e.g., sorted distinct x-values, sorted distinct y-values, and sorted distinct z-values from the data set). For each dimension, each point cloud data entry may be assigned to one of a plurality of cells, and in accordance therewith, codes may be generated for each point cloud data entry corresponding the cells in each dimension that a point cloud data entry is assigned to, for example. An offset defining a position within each cell of each point cloud data entry may also be stored in the space-filling data structure, for example, and the codes and offsets corresponding to the point cloud data entries may be sorted.

At 203, the space-filling curve data structure and the dictionary space data structure may be stored in a database.

Embodiments of the disclosure include performing a multidimensional query of the stored point cloud data. For example, at 204, a range query is received. The range query may specify ranges of x, y, or z values to be retrieved, for example. At 205, codes in the query range are determined. At 206, a candidate set in the space-filling curve data structure is for searched based on the codes in the query range (e.g., qSPCcodes illustrated below). At 207, one or more query result point cloud data entries is determined from a plurality of point cloud data entries in the candidate set based on the offsets in the space-filling curve data structure and the values in the dictionary space data structure. The query result point cloud data entries may be checked, for example, to ensure they have values within the query range, for example.

The following description provide more details about example embodiments of the present disclosure.

Dictionary-Based Compression

Point cloud data typically includes a plurality of point cloud data sets, where each point cloud data set includes a plurality of dimensions describing a position (e.g., (x,y,z)-values for different points). In many example applications, the values for x, y, and z coordinates (not the points themselves) may repeat across point cloud entries frequently (e.g., two points at the same height on different sides of a hill). Such patterns in data distribution may be exploited by employing dictionary based compression (DBC), for example.

Figure 3:
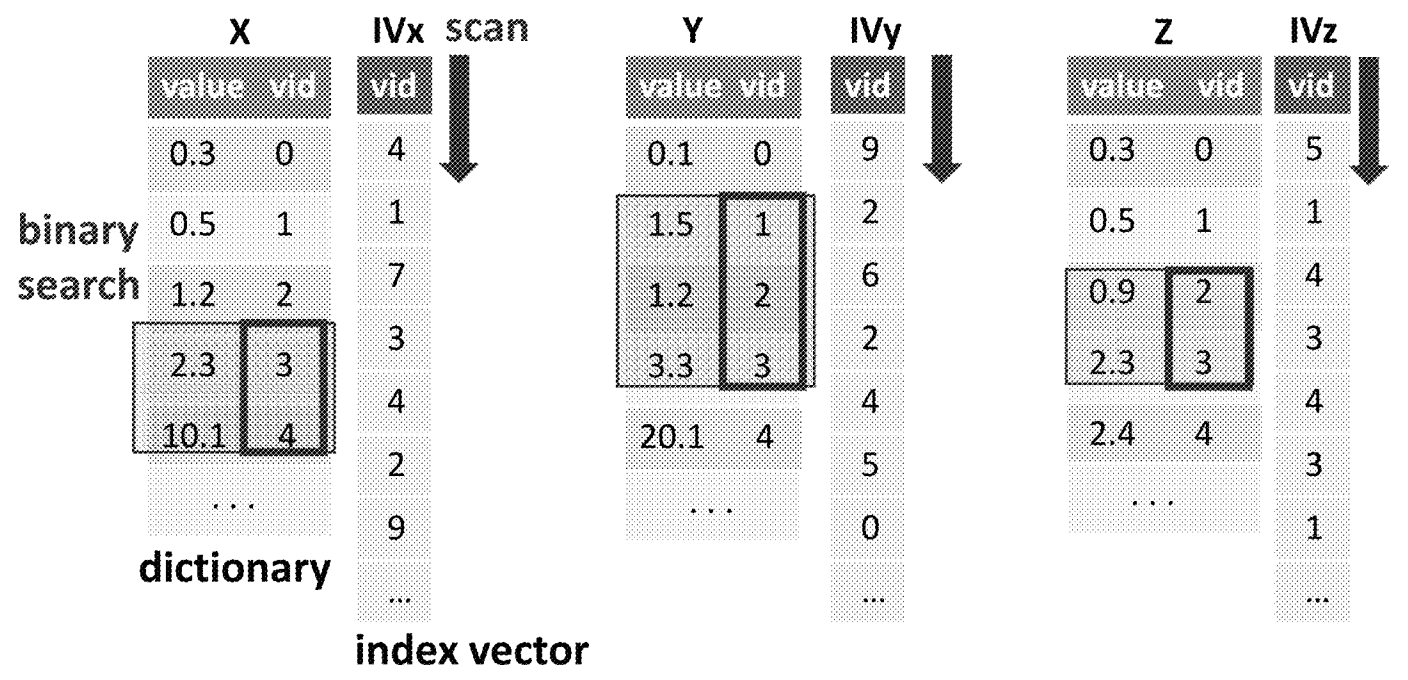

In one embodiment, DBC may compress a column by mapping its domain to a list of continuous integer values, for example. For instance, a DBC process may replace wide values in the attribute domain with smaller codes. Its simplest form consists of a dictionary and an index vector (IV). The dictionary stores the sorted distinct values of the column domain, while the IV maps each point to its position in the dictionary. As illustrated in FIG. 3, DBC may be applied in the context of point clouds to represent point cloud data as three independent columns—one for each dimension of the 3D space—composed of a dictionary and an IV. The dictionary stores the sorted distinct values for the corresponding dimension and the IV maps the point to its corresponding position in the dictionary. A 3D range query may be executed by performing search (e.g., a binary search) on the dictionary of each dimension to identify values and their corresponding positions in dictionaries that intersect with the query range. The binary search may be followed by a scan of the corresponding IV to identify the records that match the identified dictionary position.

DBC compression may be improved by leveraging a correlation within and across point cloud entries. As mentioned above, a point cloud entry is represented with x, y, and z coordinates that are correlated, i.e., they describe a point in 3D space. Moreover, there is a correlation across the points. Points close together in 3D space may be frequently processed (e.g., queried) together. Therefore, various embodiments of the present disclosure may take advantage of this property and organize data to persevere spatial proximity. Consequently, a search range may be restricted using an index structure (e.g., that combines all 3 dimensions) and improve the data access patterns. However, an index-like structure normally increases the storage footprint, so it is a challenge to achieve this in both time and space-efficient manner, for example.

Space-Filling Curves

One example technique to preserve and exploit spatial data properties is by using Space-filling Curves (SFC). SFC-based organization transforms data from a multi- to a one-dimensional (1D) domain using a SFC to impose a total, 1D order by visiting all the points in a d-dimensional grid exactly once, for example. The Hilbert curve, the Gray-code curve, and the Z-order are examples of SFC curves that are effective in preserving spatial proximity. An SFC-based organization may be used to preserve and exploit spatial data properties due to its suitability for database storage, such as a column-store DBMS, for example. By transforming data to a 1D domain, spatial proximity may not be preserved to the same extent as with multi-dimensional data structures. However, the ability to employ efficient scans of vector data may be retained. Simplicity and efficiency in the preprocessing step may be additional benefits of this approach in some example applications.

Space-Filling Curves (SFCs) may have an order. An example SFC order may reorganize data in three steps: (1) Partition the dataset's universe with a uniform grid and assign to each cell a value on the space-filling curve (SFCcode), (2) Assign an SFCcode to every point cloud entry according to the grid cell a particular point cloud data entry belongs to, where multiple point cloud entries can map to the same SFCcode value, for example, and (3) Sort the points based on the assigned SFCcode.

In one embodiment, a query against the cloud point data is a range query. In one example embodiment, range query execution is composed of two steps. 1) Transform a query to the 1D domain according to the SFC-order and perform binary search on the SFCcodes data structure based on the transformed ranges. 2) As a SFCcode is assigned per cell and not per point basis, all the points whose SFCcode matches the result of the binary search have to be additionally checked whether they belong to the query range in order to remove false positives. The curve may be partitioned into multiple sub-intervals, each of which may be fully contained in the original range, in order to minimize the number of checks in the second step.

Space-Filling Curve—Dictionary-Based Compression

To efficiently employ DBC in the spatial domain, embodiments of the present disclosure may use Space-Filling Curve Dictionary-Based Compression (SFC-DBC), a solution for storing and managing point cloud data that may be driven both by time and space efficiency requirements, for example. SFC-DBC combines DBC with SFC order to ensure space efficiency and preserve spatial proximity, thus optimizing for query execution. Various embodiments may apply DBC in the spatial domain and enhances it with indexing capabilities without introducing additional storage requirements.

SFC-DBC represents a point cloud entry through its position in an artificially introduced 3D dictionary space and indexes it using a SFC order. The dictionary space is a compressed 3D space that we reconstruct from x, y, and z dictionaries. To do so, we exploit the fact that the dictionaries resemble the dataset space (universe) when combined, since each of them is sorted according to the corresponding dimension. SFC-DBC represents and indexes a point cloud entry using a SFC order constructed over this 3D space.

Figure 4:
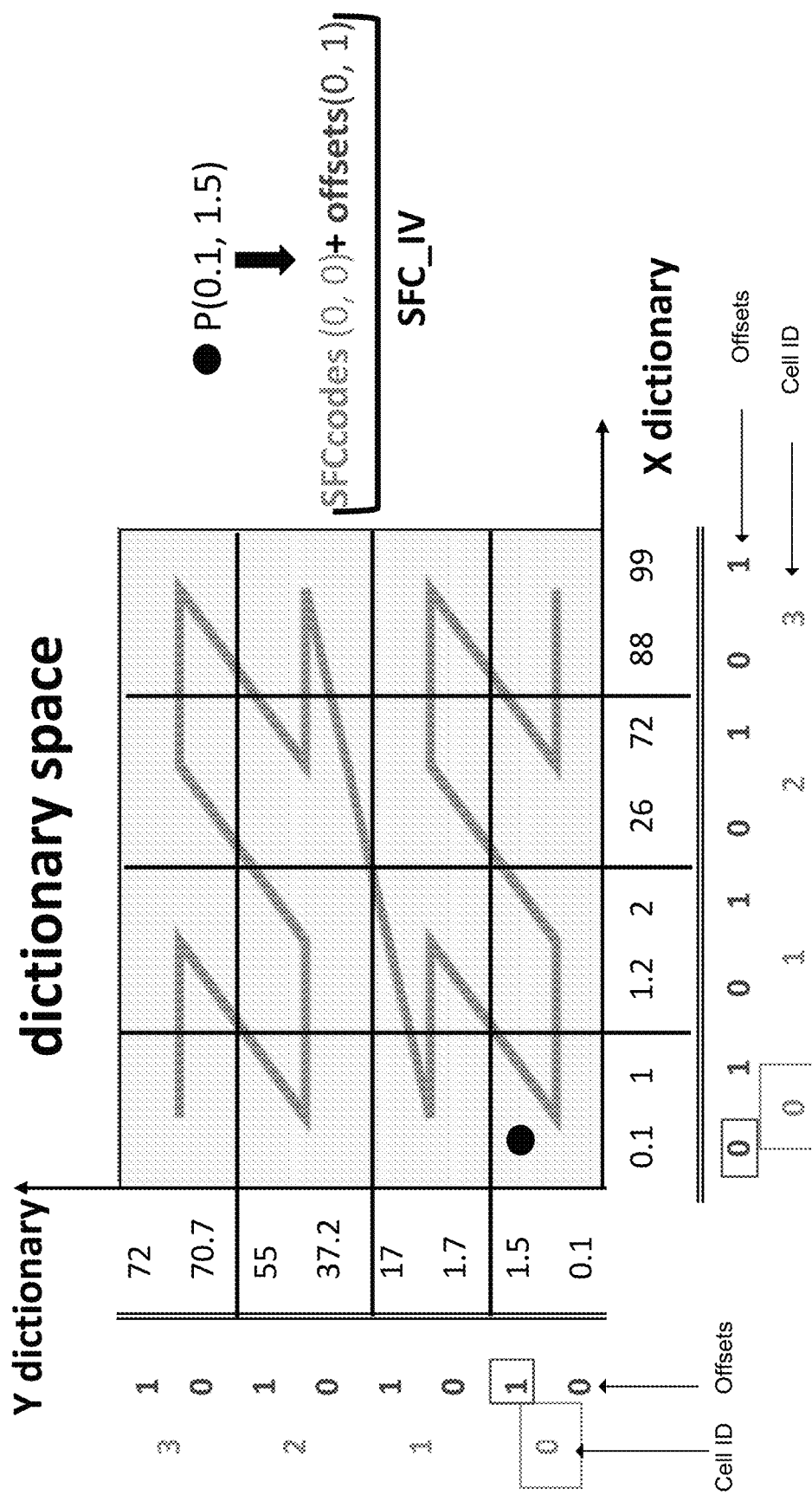
FIG. 4 illustrates associating cloud point data with cells, codes, and offsets.

FIG. 4 illustrates the dictionary space where, for the sake of simplicity, we use a 2D illustration. The SFC order (a Z-order in our example) is constructed over the dictionary space, by partitioning it into four cells per dimension. SFC-DBC represents and indexes a point cloud entry with its position in the SFC order, i.e., with the assigned SFCcode which identifies the dictionary space cell that the point belongs to. As multiple points can map to the same SFC-code, to uniquely represent the position of the point in the dictionary space (and thus its value), SFC-DBC additionally captures the position within the cell that the point belongs to. For instance, in FIG. 4 a point P (0.1, 1.5) is represented through our encoding scheme with a SFCcode that encodes the cell ids that P maps to (e.g., 0 and 0 value for x and y coordinate, indicated with blue color) and with the offsets that store the position of P within a cell (e.g., 0 and 1 value for x and y coordinate, indicated with red color).

SFC-DBC significantly improves query execution, and yet it does not require additional storage resources. Advantageously, a SFC order is integrated into the dictionary space model. Consequently, the SFC order plays the role of the index vector (IV) data structure (mentioned above) while preserving spatial data proximity and low storage footprint.

SFC-DBC further minimizes storage footprint and increases resilience to skew. SFC-DBC achieves this by constructing a space-filling curve over a reduced dictionary space, instead of the original data space (universe). This partitioning strategy has a twofold effect on SFC-DBC. First, it enables the integration of SFC into the dictionary model. This consequently lowers the storage footprint and assigns two roles to the SFC: the role of spatial index and IV in DBC. Second, it enables a better adjustment of SFCcodes to the distribution of the data.

Figure 5:
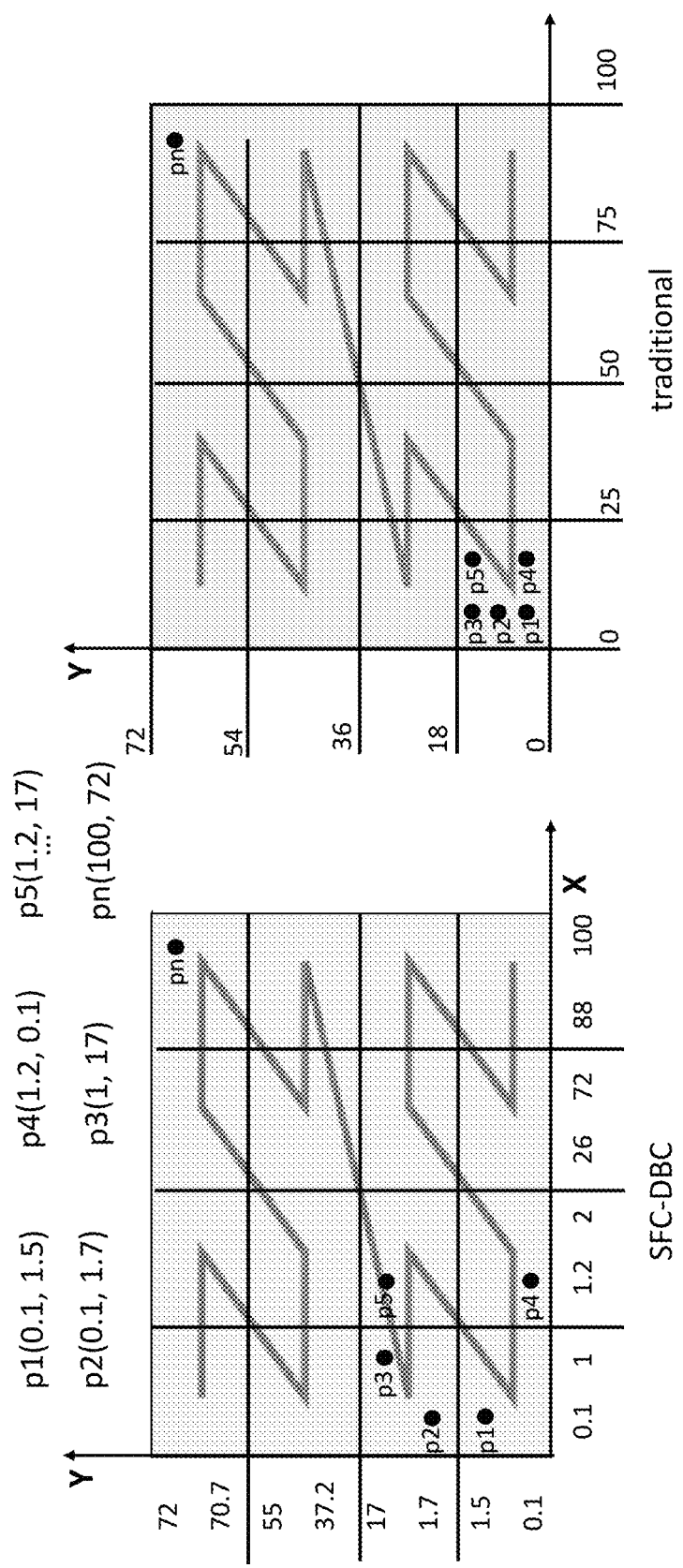
FIG. 5 illustrates an example of data partitioning using both SFC-DBC and pure SFC-based strategy.

FIG. 5 illustrates an example of data partitioning using both SFC-DBC and pure SFC-based strategy. We use the subset of a dataset represented with six points p1-p5 & pn and assume that each dimension is divided into four cells. The SFC order, constructed according to the pure SFC encoding scheme, follows space-oriented partitioning, i.e., it uses uniform partitioning of the space, regardless of data distribution. As opposed to this, SFC order in SFC-DBC is defined in a data-driven way where the cells are set based on the distribution of distinct data values. As illustrated in the example, data-driven partitioning improves skew handling, since it is done based on the actual points values. Data-partitioning also restricts the number of distinct points per cell, additionally improving skew resilience. In the example, SFC-DBC can have at most four distinct points per cell, while space-oriented partitioning may not have these guaranties. For example, the number of distinct points per cell may be derived by a given BITs Per Dimension (BPD) and the number of distinct values in that dimension. For instance, if there are 100 distinct values and 2 bits, then there are $100/2^2=100/4=25$ distinct points per cell. Accordingly, embodiments may not limit the number of points per cell, but rather, limit the number of distinct points per cell.

The following subsections illustrate example data structures and describe how to build and use them in the preprocessing and querying step.

Preprocessing & Data Structures

Embodiments of the present disclosure include an SFC-DBC approach that may represent a point cloud entry through its position in an artificially introduced 3D dictionary space indexed using a SFC order. Consequently, the preprocessing step results in two types of data structures: dictionary space data structure and space-filling curve index-like data structure. In the following we describe examples of these structures and example preprocessing steps that produce them.

Figure 6:
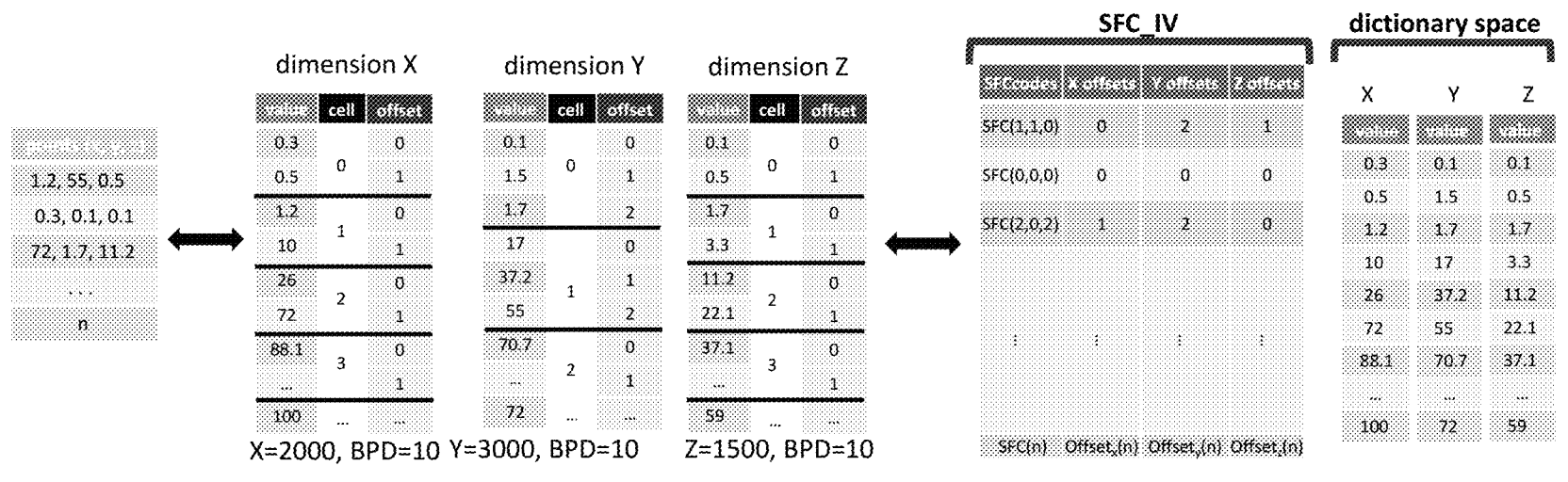

SFC-DBC operates on a dictionary space and a space-filling curve index vector (SFC_IV) data structures, as illustrated in FIG. 4 and FIG. 6. The dictionary space is a 3-dimensional space reconstructed from x, y, and z dictionaries that captures the distinct values of point cloud entries in each dimension. The space-filling curve data structure maps each point to its position in the dictionary space, and in accordance therewith, its value. In other words, referring to FIG. 6, the space-filling curve data structure maps a record for each point cloud data entry (e.g., [SFC(1,1,0), 0, 2, 1]) to a particular position in the dictionary space where values for the point cloud data entry are stored. At the same time, it may play the role of a spatial index by encoding the point through its position in the SFC order constructed on top of the dictionary space. To uniquely identify the position of a point in dictionary space, SFC_IV may include SFC-codes and offsets vectors. The SFCcodes vector maps the point to its position in the SFC order based on the assigned SFCcode. The corresponding SFCcode does not uniquely identify the position of the point in the dictionary space but rather the cell it is in, as a point cloud entry may not have a unique representation in the SFC order. Therefore, we additionally capture the position of the point within the cell using the offsets vector in the SFC data structure.

In one embodiment, the SFCcodes structure may additionally be compressed to minimize the storage requirements. The offsets may not be compressed, but may be stored in a minimal format. For example, if 8 is the highest offset there is, then only 3 BITS may be used to encode each individual offset. More precisely, considering that multiple points may map to the same SFCcode, we store just the distinct SFCcodes values and their corresponding starting positions in the input. For example, if an SFCcode 1 starts at position 5 and then SFCcode 2 starts at position 42, then that means that positions 5 to 41 have an SFCcode of 1.

In one embodiment, preprocessing may include four tasks described through an example illustrated in FIG. 6. First, we begin by producing a 3D dictionary space and a grid on top of it. More precisely, we produce a dictionary per dimension and divide them into cells, for each dimension independently. The number of cells is determined by the number of bits assigned per dimension (BPD) in the SFCcode and it corresponds to $2^{BPD}$. For example, bits per dimension (BPD) may be as an input because it greatly affects the storage requirements, where the number of cells is 2^BPD cells per dimension. For instance, in the example (FIG. 6), the x dictionary is divided into 1024 cells as BPD corresponds to 10. Consequently, every cell has two dictionary entries, given that the number of entries in the x dictionary is 2000. Notice that the number of entries per cell (EPC) differs between x, y, and z dimensions as the dictionaries have different sizes (depending on the number of distinct values per dimension). Other embodiments may infer BPD based on some other measure such as the maximum number of points we want to have per cell, for example.

Second, once the dictionary space is partitioned, we assign a SFCcode to every point according to the dictionary cells they belong to. For instance, the first point P (1.2, 55, 0.5) in the example (FIG. 6) belongs to the cells with ids 1, 1 and 0 for the x, y, and z dimension respectively, and thus the SFCcode encodes these ids. The ids, however, do not uniquely identify the position of the point in the dictionaries. To do so, in the third step we additionally store the position of the point within the cells (FIG. 6, offsets)—therefore, for the first point we store 0, 2 and 1 values according to x, y, and z dimensions. Lastly, once the final structures are produced, we sort them according to the assigned SFCcode. The following is an example algorithm for creating a space-filling curve data structure and a dictionary space data structure from input point cloud data. Given a multiset of three dimensional points, π is the projection function. In case of $\pi_x$ it returns the multiset of x-coordinate values from the input point cloud data. On a dictionary Dx the function lookupPos takes a x-coordiante value and returns the position it has in the given dictionary. It is the inverse function to lookupValue.

Encoding a multiset of points
Input: Multiset of Points S, BPDx;BPDy;BPDy
Output: SFC IV structure, dictionary space structure and ElementsPerCell
$Sx := \pi_x(S)$;
$Sy := \pi_y(S)$;—split S into Sx; Sy; Sz, the multisets
$Sz := \pi_z(S)$;—of x-, y- and z-coordinates of the points.
Dx:=unqiue(sort(Sx));—Next, we sort all respective multisets
Dy:=unqiue(sort(Sy));—and filter out duplicates.
Dz:=unqiue(sort(Sz));—Dx;Dy;Dz, now represent the dictionary space
ElementsPerCellx:=$\lceil |Dx| \div 2^{BPDx} \rceil$;
ElementsPerCelly:=$\lceil |Dy| \div 2^{BPDy} \rceil$;
ElementsPerCellz:=$\lceil |Dz| \div 2^{BPDz} \rceil$;
   For every point in S we want to find the SFCcode and the offset for i:=0 to |S|−1 do
   cellxi:=$\lfloor Dx.lookupPos(Sxi) \div ElementsPerCellx \rfloor$
   cellyi:=$\lfloor Dy.lookupPos(Syi) \div ElementsPerCelly \rfloor$
   cellzi:=$\lfloor Dz.lookupPos(Szi) \div ElementsPerCellz \rfloor$
   SFCcodes$_i$:=SFC(cellxi; cellyi; cellzi);
   offset$_{xi}$:=Dx:lookupPos($S_{xi}$)mod ElementsPerCellx;
   offset$_{yi}$:=Dy:lookupPos($S_{yi}$)mod ElementsPerCelly;
   offset$_{zi}$:=Dz:lookupPos($S_{zi}$)mod ElementsPerCellz;
end_for
SFC IV:=SFC IV(SFCcodes; offsetx; offsety; offsetz);
dictionary space:=dictionary space(Dx,Dy,Dz, ElementsPerCellx, ElementsPerCelly, ElementsPerCellz);
return SFC IV; dictionary space Single points may be retrieved using the following algorithm:
Decoding a single point
Input: Index of the point i, SFC IV, dictionary space D
Output: The decoded point
cellxi, cellyi, cellzi:=SFC IV:SFCcodes[i]:getCells( )
offset, offset, offsetz:=SFC IV:getOffsets[i];
ElementsPerCellx, ElementsPerCelly, ElementsPerCellz:=D:getElementsPerCell( );
Positionxi:=cellxi*ElementsPerCellx+offsetx;
Positionyi:=cellyi*ElementsPerCelly+offsety;
Positionzi:=cellzi*ElementsPerCellz+offsetz;
Valuex:=D:X:lookupValue(Positionxi);
Valuey:=D:Y:lookupValue(Positionyi);
Valuez:=D:Z:lookupValue(Positionzi);
return Point(Valuex;Valuey;Valuez);

Query Execution

Query execution may comprise two steps. In the first step, the SFCcodes vector restricts a search space by producing the candidate results set, while in the second step we additionally prune, i.e., remove false positive results.

The first step is illustrated in Algorithm 1 below. The query execution first transforms a query range to a one-dimensional (1D) domain, by determining its position in the dictionary space and calculating the corresponding query codes—qSFCcodes. Based on the produced codes, a candidate result set is determined by performing binary search on the SFCcodes vector. The following is an example algorithm for transforming a query range to a one-dimensional domain.

---

Algorithm 1: Query Execution: produce candidate results set

Input: q: range query -- defined with two coordinates
Output: minDQ, maxDQ: min and max position in dictionary that corresponds to query range
Output: candidateSet: candidate result set
//transforms query to 1D:
for d = 0 to dimensions do
    minDQ[d] = binaryS (dictionary[d],q.low[d])
    maxDQ[d] = binaryS (dictionary[d],q.high[d])
end
qSFCcodes = calcSFCcode (q,minDQ,maxDQ)
candidateSet = binaryS (qSFCcodes, SFCcodes )
return candidateSet

---

The resulting candidate set produced during the first step of the query process may contain false positive results considering that the SFCcode is assigned per cell and not per point. Therefore, the second step may check if the identified points indeed belong to the query range. To do so, we reconstruct the position of the point in the dictionary (and thus its value) for the points identified in the candidate results set and check if they belong to the query range. We perform this algorithm for all three dimensions in parallel, as illustrated in Algorithm 2. More precisely, the position is reconstructed by combining the decoded SFCcode and offset values, e.g., applying the following formula for the corresponding dimension:

$$\text{position} = \text{cell\_idx} \# \text{EPC} + \text{offsets} \quad (1)$$

where cell_id represents the dictionary cell id obtained by decoding the SFCcode for the corresponding dimension and EPC stands for the number of entries per cell in the corresponding dictionary. Once the position is reconstructed, we check if it belongs to the query range <minDQ,maxDQ>, which corresponds to the minimum and maximum position in the dictionary that the query maps to (obtained in Algorithm 1).

In one embodiment, the process may include a scan the offsets vector and the decoding of the SFCcode. As the decoding is done once per distinct SFCcode value (once a value is decoded it is reused for all the points that have the same SFCcode), the scan of the offsets vector may dominate the total execution time in some implementations, for example. Therefore, to optimize the offsets vector scan, SFC-DBC minimizes the number of the offset entries necessary to be examined by skipping the entries that are completely enclosed by the query range. This can be done by checking the enclosedByQuery condition during query execution (e.g., See Algorithm 2 below), which requires just the decoded SFCcode and EPC values in order to calculate the minimum and maximum position in dictionary that the points with a given SFCcode can map to. The following algorithm illustrates the second step of query execution to produce the final result set.

---

Algorithm 2: Query Execution: produce final results set

Input: q: range query - defined with two coordinates
Input: candidateSet: candidate result set
Input: minDQ, maxDQ: min and max position in dictionary that corresponds to query range
Input: EPC: number of entries per cell, d - dimension
Output: pOut: point cloud result set
for i = value in candidateSet do
    cell_id = decode (SFCCodes[i],d)
    base = cell_id * EPC[d]
    //retrieve the positions of the points for the given SFCcode
    <inputMin, inputMax> = mapSFCcodeToInputPosition(i)

-continued

Algorithm 2: Query Execution: produce final results set

```
//enclosedByQuery condition
    if minDQ[d] <= base AND (base + EPC[d]-1) <= maxDQ[d]
    then
        pOut .setRanДe (inputMin, inputMax)
        continue
    end
//not enclosedByQuery - retrieve offsets
    for j = inputMin; j < inputMax do
        position = base + offsets[j];
        if minDQ <= position <= maxDQ then
            pOut .set (j )
        end
    end
end
return pOut
```

The following is an example of a query execution. First, the process starts with an example column containing two dimensional points.
C:={(0; 0); (0; 1); (0; 2); (0; 3);
  (1; 0); (1; 1); (1; 2); (1; 3);
  (2; 0); (2; 1); (2; 2);
  (3; 0); (3; 1); (3; 2); (3; 3)}

Notice that (2, 3) is not in the column. The dictionaries for x and y look identical:

TABLE 1

| ValueId | Value |
| --- | --- |
| 0 | 0 |
| 1 | 1 |
| 2 | 2 |
| 3 | 3 |

Let's now assume that we defined the Bits Per Dimension (BPD) to be equal to 2. We defined the space-filling curve (SFC) to be the Z curve. We have 2 dimensions, thus 4 bits, thus 16 cells on our SFC. This is one cell more than we have points. Therefore, our number of entries per cell (EPC) is 1.

The order is given explicitly:
SFC(0; 0)<SFC(1; 0)<SFC(0; 1)<SFC(1; 1)<SFC(2; 0)<SFC(3; 0)<SFC(2; 1)<SFC(3; 1)<SFC(0; 2)<SFC(1; 2)<SFC(0; 3)<SFC(1; 3)<SFC(2; 2)<SFC(3; 2)<SFC(3; 3)

SFC IV data structure is sorted by the SFC value. In our example all offsets are 0 because we have just one distinct value for every cell.

TABLE 2

| SFCcode | X offset | Y offset |
| --- | --- | --- |
| SFC(0, 0) = 0 | 0 | 0 |
| SFC(1, 0) = 1 | 0 | 0 |
| SFC(0, 1) = 2 | 0 | 0 |
| SFC(1, 1) = 3 | 0 | 0 |
| SFC(2, 0) = 4 | 0 | 0 |
| SFC(3, 0) = 5 | 0 | 0 |
| SFC(2, 1) = 6 | 0 | 0 |
| SFC(3, 1) = 7 | 0 | 0 |
| SFC(0, 2) = 8 | 0 | 0 |
| SFC(1, 2) = 9 | 0 | 0 |
| SFC(0, 3) = 10 | 0 | 0 |
| SFC(1, 3) = 11 | 0 | 0 |
| SFC(2, 2) = 12 | 0 | 0 |
| SFC(3, 2) = 13 | 0 | 0 |
| SFC(3, 3) = 15 | 0 | 0 |

Notice that we don't have a point with SFC(2,3)=14 in the column.

For the Query, assume that the rectangular query window Q is defined by the lower left corner point (0, 0) and the upper right corner point (2, 1).
Example Execution of Algorithm 1
minDQ[0]=binaryS(dictionary[0]; Q:low[0])=0
maxDQ[0]=binaryS(dictionary[0]; Q:high[0])=2
minDQ[1]=binaryS(dictionary[1]; Q:low[1])=0
maxDQ[1]=binaryS(dictionary[1]; Q:high[1])=1
qSFCcodes=calcSFCcodes(Q; minDQ;maxDQ)=(0; 6)

So the lower SFC code is 0 and the higher SFC code is 6. Thus our candidates are the first 7 entries in the SFC IV structure as they have SFCcodes between 0 and 6 as follows:
candidatesSet=binaryS(qSFCcodes; SFCcodeds)=(0; 1; 2; 3; 4; 5; 6)
Algorithm 2
Input: Q=((0, 0), (2, 1))
Input: candidateSet=(0,1,2,3,4,5,6)
Input: minDQ=(0, 0), maxDQ=(2, 1)
Input: EPC=1

We will run this algorithms for the candidate 1 and dimension x(=0). The other candidates work similar.
Let i=1.
SFCCodes[1]=1
cell id=decode(1; 0)=1
base=cell id*EPC[0]=1*1=1
(inputMin; inputMax)=mapSFCcodeToInputPosition(i)=(1; 1)
minDQ[0]<=base AND (base+EPC[0]-1)<=maxDQ[0], 0<=1 AND 1<=2=true Therefore, we continue with the next iteration of the for loop.

Therefore, we add 1 to the result set for the x dimension. After testing all other candidates for all dimensions, we intersect the result sets of the dimensions and get the final result set.

Various embodiments of SFC-DBC may enhance dictionary-based compression with indexing capabilities, optimizing for query execution without introducing additional space requirements. Therefore, in the following we analyze the space requirements of the baseline DBC and SFC-DBC.

A baseline DBC operates based on dictionaries and IV. Therefore, its total space requirements correspond to Equation 2 as follows:

$$3 \times (DS \times de + n \times \log_2 DS) \quad (2)$$

For the sake of simplicity we assume that each dictionary in 3D space has the same length. More precisely, $3 \times DS \times de$ represents the space requirements of the dictionaries, where DS and de are the number of entries and the size of an entry in the corresponding dictionary, respectively. IVs corresponds to $3 \times n \times \log_2 DS$, where n is the number of points and $\log_2 DS$ is the number of bits per IV entry, which corresponds to the number of bits necessary to represent the maximum position in the corresponding dictionary.

On the other hand, the SFC-DBC approach stores dictionaries, offsets and SFCcodes vectors, resulting in the total space requirements illustrated in Equation 3 as follows.

$$3 \times (DS \times de + n \times \log_2 DS [DS/2^{BPD}]) + \#SFCcode \times BPD) = 3 \times (DS \times de + n \times \log_2 DS - n \times BPD + \#SFC\text{-}code \times BPD) \quad (3)$$

More precisely, the dictionaries are represented with $3 \times DS \times de$, the offsets vectors with $3 \times n \times \log_2 DS [DS/2^{BPD}]$ where BPD is the number of bits assigned per dimension, while the SFCcodes vector corresponds to $\#SFCcode \times 3 \times$ BPD where #SFCcode represents the number of distinct SFCcode values. Compared to the space requirements of the baseline DBC—the dictionaries may be identical, offsets vector minimizes the resources of IV since an offset entry indexes the values within a dictionary cell as opposed to the entire dictionary, while SFCcodes vector introduces additional space requirements.

Therefore, comparing the requirements of both approaches (according to Equation 2 and Equation 3), the SFC-DBC approach subtracts 3×n×BPD, while at the same time it introduces an additional overhead in the form of 3×#SFCcode×BPD. Considering that n≥#SFCcode, the benefit is higher than the overhead and thus, the space requirements of SFC-DBC are always smaller or equal to the requirements of DBC.

Figure 7:
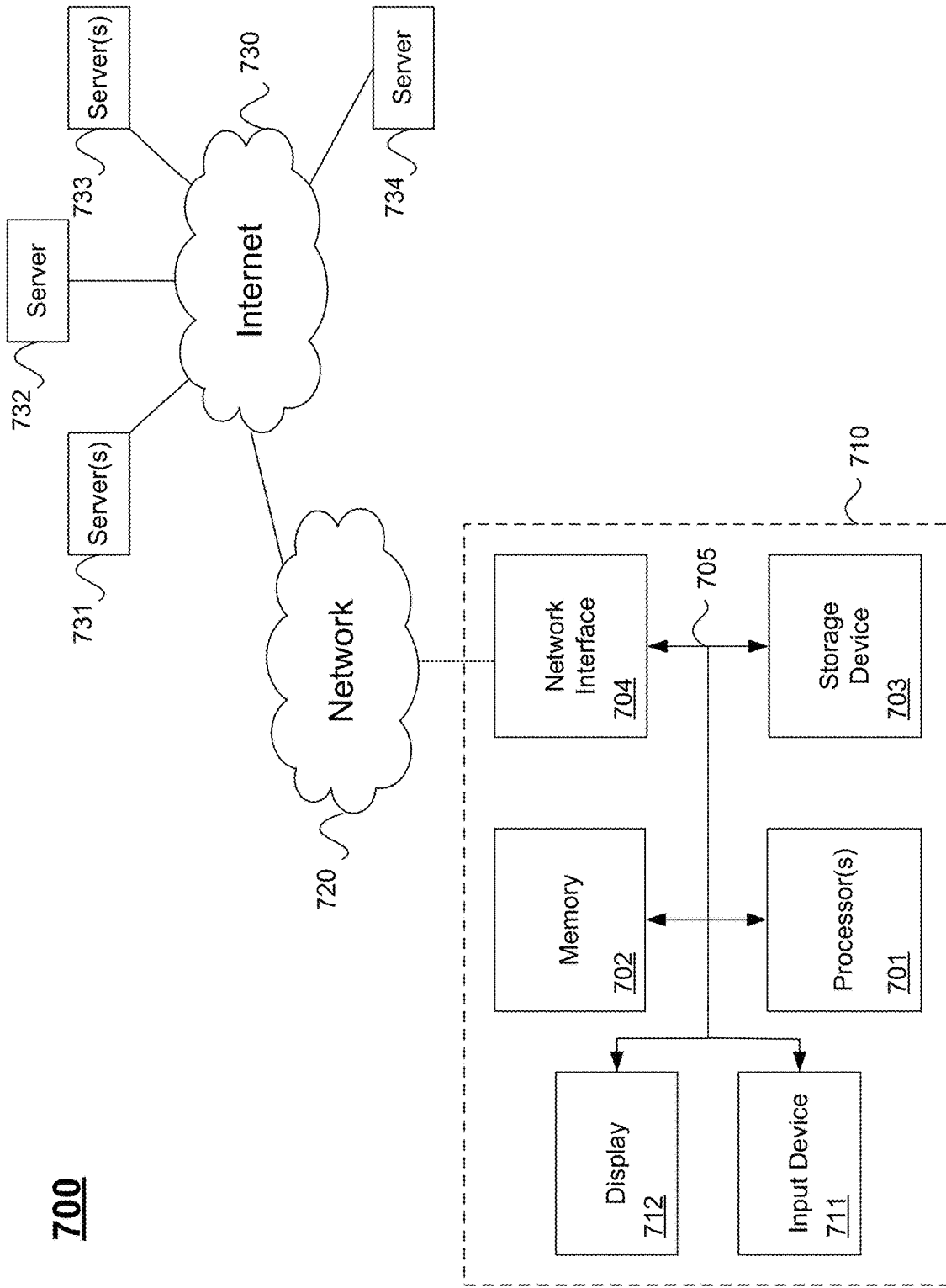
FIG. 7 illustrates example computer system hardware configured according to some embodiments.

FIG. 7 illustrates computer system hardware configured according to the above disclosure. The following hardware description is merely one example. It is to be understood that a variety of computers topologies may be used to implement the above described techniques. An example computer system 710 is illustrated in FIG. 7. Computer system 710 includes a bus 705 or other communication mechanism for communicating information, and one or more processor(s) 701 coupled with bus 705 for processing information. Computer system 710 also includes a memory 702 coupled to bus 705 for storing information and instructions to be executed by processor 701, including information and instructions for performing some of the techniques described above, for example. Memory 702 may also be used for storing programs executed by processor(s) 701. Possible implementations of memory 702 may be, but are not limited to, random access memory (RAM), read only memory (ROM), or both. A storage device 703 is also provided for storing information and instructions. Common forms of storage devices include, for example, a hard drive, a magnetic disk, an optical disk, a CD-ROM, a DVD, a flash or other non-volatile memory, a USB memory card, or any other medium from which a computer can read. Storage device 703 may include source code, binary code, or software files for performing the techniques above, for example. Storage device 703 and memory 702 are both examples of non-transitory computer readable storage mediums.

Computer system 710 may be coupled via bus 705 to a display 712 for displaying information to a computer user. An input device 711 such as a keyboard, touchscreen, and/or mouse is coupled to bus 705 for communicating information and command selections from the user to processor 701. The combination of these components allows the user to communicate with the system. In some systems, bus 705 represents multiple specialized buses for coupling various components of the computer together, for example.

Computer system 710 also includes a network interface 704 coupled with bus 705. Network interface 704 may provide two-way data communication between computer system 710 and a local network 720. Network 720 may represent one or multiple networking technologies, such as Ethernet, local wireless networks (e.g., WiFi), or cellular networks, for example. The network interface 704 may be a wireless or wired connection, for example. Computer system 710 can send and receive information through the network interface 704 across a wired or wireless local area network, an Intranet, or a cellular network to the Internet 730, for example. In some embodiments, a browser, for example, may access data and features on backend software systems that may reside on multiple different hardware servers across the Internet 730 on servers 731-735. One or more of servers 731-735 may reside locally or in a remote cloud computing environment, for example.

The above description illustrates various embodiments of the present disclosure along with examples of how aspects of the particular embodiments may be implemented. The above examples should not be deemed to be the only embodiments, and are presented to illustrate the flexibility and advantages of the particular embodiments as defined by the following claims. Based on the above disclosure and the following claims, other arrangements, embodiments, implementations and equivalents may be employed without departing from the scope of the present disclosure as defined by the claims.

What is claimed is:

1. A computer implemented method comprising:
receiving point cloud data, the point cloud data comprising a plurality of point cloud data entries, each point cloud data entry comprising a plurality of values for a corresponding plurality of dimensions to describe a position;
mapping the point cloud data to a dictionary space data structure and a space-filling curve data structure, wherein:
the dictionary space data structure captures the distinct values of point cloud data in each dimension,
the space-filling curve data structure partitions the plurality of cloud point data entries across a grid comprising a plurality of cells across the plurality of dimensions, and
the space-filling curve data structure comprises, for each particular point cloud data entry, a code of a plurality of codes and a plurality of offsets, the code including an identifier for each dimension of the plurality of dimensions and identifying a particular cell of the plurality of cells, the particular cell comprising a plurality of point cloud data entries including the particular point, the plurality of offsets including an offset for each dimension of the plurality of dimensions, the plurality of offsets uniquely identifying the particular point cloud data entry from among the plurality of point cloud data entries in the particular cell, and
the space-filling curve data structure maps a record for each point cloud data entry to a particular position in the dictionary space where a value for the point cloud data entry is stored, the particular position in the dictionary space based on a combination of the code and the plurality of offsets for the point cloud data entry, and
storing the space-filling curve data structure and the dictionary space data structure in a database.

2. The method of claim 1 wherein each cell comprises a maximum number of point cloud data entries.

3. The method of claim 1 wherein the cells are formed by dividing a total number of distinct values in each dimension into a plurality of segments along each dimension, wherein each segment has the same number of distinct values for a particular dimension.

4. The method of claim 1 wherein segments for a first dimension have a same number of distinct allies as segments for a second dimension.

5. The method of claim 1 wherein segments for a first dimension have a different number of distinct values as segments for a second dimension.

6. The method of claim 1 wherein the dictionary space data structure comprises a plurality of entries comprising values for each dimension.

7. The method of claim 6 wherein the dictionary space data structure comprises a first set of values for an x-dimension and a second set of values for a y-dimension.

8. The data compression method of claim 6 wherein the dictionary space data structure comprises a third set of values for z-dimension.

9. The method of claim 1 wherein each code corresponds to a plurality of point cloud data entries in a cell and the offsets corresponding to each code uniquely identify a point cloud data entry in the cell.

10. The method of claim 1 wherein the mapping transforms the point cloud data from the plurality of dimensions to one dimension.

11. The method of claim 1 wherein the codes are generated using a space-filling curve.

12. The method of claim 11 wherein the space-filling curve is one of a Hilbert curve, the Gray-code curve, or the Z-order.

13. The method of claim 1 wherein mapping comprises:
generating a plurality of dimension dictionaries for the dictionary space, wherein each dimension dictionaries comprises sorted distinct values of the point cloud data;
for each dimension, assigning each point cloud data entry to one of a plurality of cells, and in accordance therewith, generating codes for each point cloud data entry corresponding the cells in each dimension that a point cloud data entry is assigned to;
storing an offset defining a position within each cell of each point cloud data entry; and
sorting the codes and offsets corresponding to the point cloud data entries.

14. The method of claim 1 further comprising performing a multidimensional query of the stored point cloud data comprising:
determining codes in a query range;
searching for a candidate set in the space-filling curve data structure based on the codes in the query range; and
determining one or more query result point cloud data entries from a plurality of point cloud data entries in the candidate set based on the offsets in the space-filling curve data structure and the values in the dictionary space data structure, wherein the query result point cloud data entries have values within the query range.

15. The method of claim 1, wherein the space-filling curve data structure is compressed and wherein the offsets are stored using a number of bits based on a number of the plurality of offsets.

16. The method of claim 1, wherein the space-filling curve data structure is sorted by codes and offsets.

17. A non-transitory machine-readable medium storing a program executable by at least one processing unit of a computer, the program comprising sets of instructions for:
receiving point cloud data, the point cloud data comprising a plurality of point cloud data entries, each point cloud data entry comprising a plurality of values for a corresponding plurality of dimensions to describe a position;
mapping the point cloud data to a dictionary space data structure and a space-filling curve data structure, wherein:
the dictionary space data structure captures the distinct values of point cloud data in each dimension,
the space-filling curve data structure partitions the plurality of cloud point data entries across a grid comprising a plurality of cells across the plurality of dimensions, and
the space-filling curve data structure comprises, for each particular point cloud data entry, a code of a plurality of codes and a plurality of offsets, the code including an identifier for each dimension of the plurality of dimensions and identifying a particular cell of the plurality of cells, the particular cell comprising a plurality of point cloud data entries including the particular point, the plurality of offsets including an offset for each dimension of the plurality of dimensions, the plurality of offsets uniquely identifying the particular point cloud data entry from among the plurality of point cloud data entries in the particular cell, and
the space-filling curve data structure maps a record for each point cloud data entry to a particular position in the dictionary space where a value for the point cloud data entry is stored, the particular position in the dictionary space based on a combination of the code and the plurality of offsets for the point cloud data entry, and
storing the space-filling curve data structure and the dictionary space data structure in a database.

18. The non-transitory machine-readable medium of claim 17, wherein the space-filling curve data structure is compressed and wherein the offsets are stored using a number of bits based on a number of the plurality of offsets.

19. A computer system comprising:
a processor; and
a non-transitory machine-readable medium storing a program executable by the processor, the program comprising sets of instructions for:
receiving point cloud data, the point cloud data comprising a plurality of point cloud data entries, each point cloud data entry comprising a plurality of values for a corresponding plurality of dimensions to describe a position;
mapping the point cloud data to a dictionary space data structure and a space-filling curve data structure, wherein:
the dictionary space data structure captures the distinct values of point cloud data in each dimension,
the space-filling curve data structure partitions the plurality of cloud point data entries across a grid comprising a plurality of cells across the plurality of dimensions, and
the space-filling curve data structure comprises, for each particular point cloud data entry, a code a plurality of codes and a plurality of offsets, the code including an identifier for each dimension of the plurality of dimensions and identifying a particular cell of the plurality of cells, the particular cell comprising a plurality of point cloud data entries including the particular point, the plurality of offsets including an offset for each dimension of the plurality of dimensions, the plurality of offsets uniquely identifying the particular point cloud data entry from among the plurality of point cloud data entries in the particular cell, and
wherein the space-filling curve data structure maps a record for each point cloud data entry to a particular position in the dictionary space where a value for the point cloud data entry is stored, the particular position in the dictionary space based on a combination of the code and the plurality of offsets for the point cloud data entry, and storing the space-filling curve data structure and the dictionary space data structure in a database.

20. The computer system of claim 19, wherein the space-filling curve data structure is compressed and wherein the offsets are stored using a number of bits based on a number of the plurality of offsets.

* * * * *